United States Patent [19]
Neely et al.

[11] Patent Number: 4,871,926
[45] Date of Patent: Oct. 3, 1989

[54] LOW POWER, THREE STATE POWER UP CIRCUIT

[75] Inventors: Eric Neely, Mesa; Michael Wells, Chandler, both of Ariz.

[73] Assignee: Motorola, Inc., Schaumburg, Ill.

[21] Appl. No.: 240,652

[22] Filed: Sep. 6, 1988

[51] Int. Cl.⁴ .................... H03K 5/153; H03K 17/16; H03K 17/20; H03K 17/284

[52] U.S. Cl. .............................. 307/272.3; 307/296.4; 307/592; 307/473

[58] Field of Search ............... 307/473, 475, 456, 457, 307/458, 460, 272.3, 296.4, 590, 592

[56] References Cited

U.S. PATENT DOCUMENTS

| | | | |
|---|---|---|---|
| 4,339,675 | 7/1982 | Ramsey | 307/473 |
| 4,339,676 | 7/1982 | Ramsey | 307/473 |
| 4,481,430 | 11/1984 | Houk et al. | 307/473 X |
| 4,486,674 | 12/1984 | Neely | 307/473 |
| 4,488,067 | 12/1984 | Kraft et al. | 307/473 |
| 4,745,308 | 5/1988 | Neely | 307/473 |

Primary Examiner—Stanley D. Miller
Assistant Examiner—David R. Bertelson
Attorney, Agent, or Firm—Mike Bingham

[57] ABSTRACT

A circuit for use in conjunction with an enable/disable gate of a three state logic circuit for disabling the outputs of the logic circuit during power up of the voltage supply to maintain a high impedance output state at the outputs of the logic circuits. The circuit includes a voltage level detector stage comprising a switching transistor that is held in a non-conducting state until the voltage supply reaches a predetermined potential after which the transistor is turned on and a pair of transistors configured as a current mirror with their bases coupled to the output of the switching transistor. The pair of transistors are turned on until the switching transistor is turned on to provide sufficient base current drive to a disable transistor of the enable/disable gate such that the logic circuit is disabled accordingly. An aspect of the invention is that the power up circuit draws little additional power during normal operation of the logic circuit.

4 Claims, 1 Drawing Sheet

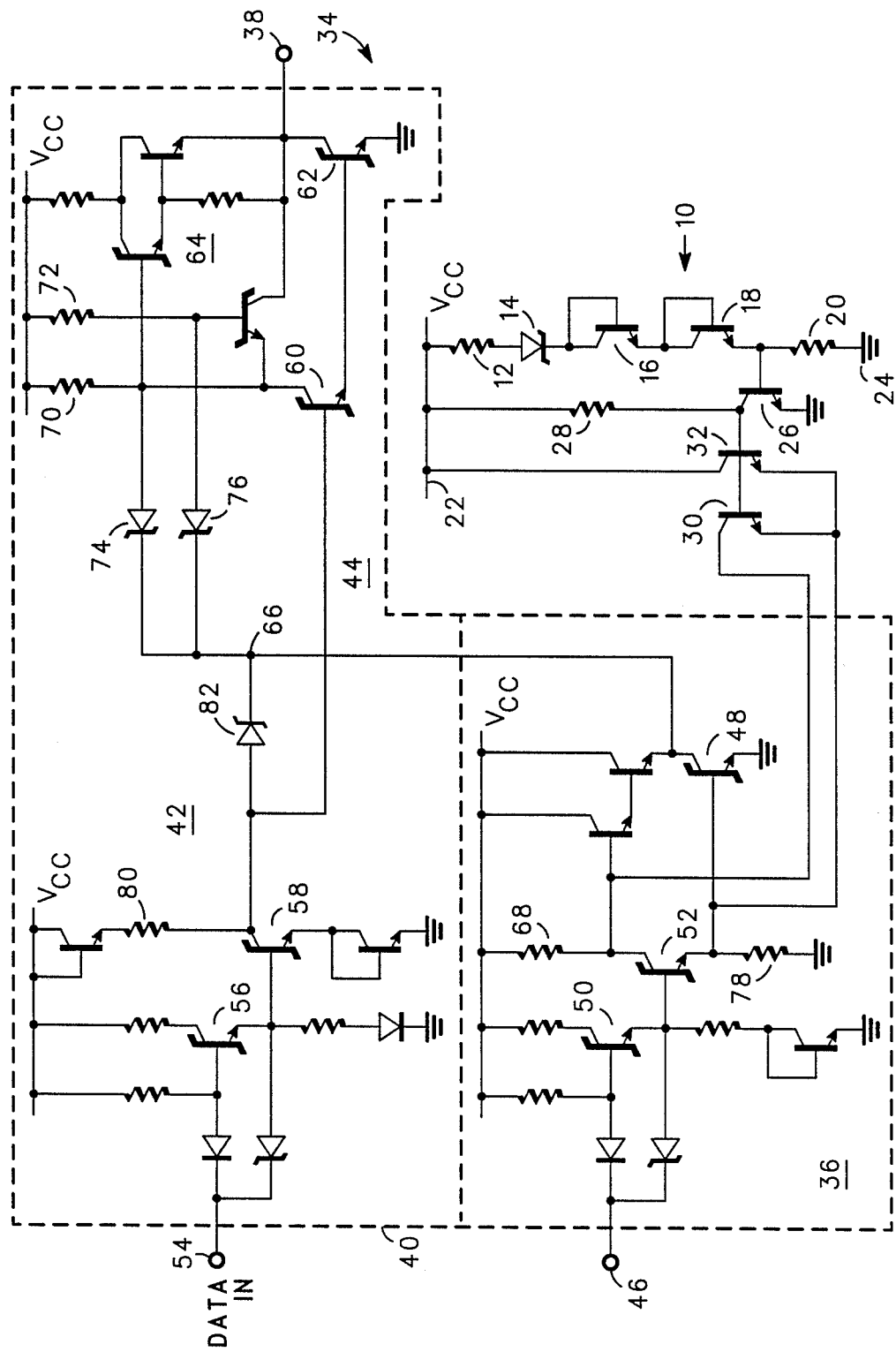

LOW POWER, THREE STATE POWER UP CIRCUIT

BACKGROUND OF THE INVENTION

The present invention is related to three state logic circuits and, more particularly, to an improved power up circuit for use therewith that ensures that the output of the logic circuit is in a high impedance state during power up of the logic circuit.

In a three state logic circuit in which one of the output states is a high impedance state it is desirable to include circuitry operating in conjunction with the output enable portion thereof to keep the output of the logic circuit in a disable state during power-up of the supply voltage. Prior art logic circuits can be found which include power up disabling circuits to which the present invention is directed. However, some, if not all, such prior art circuits are limited in their ability to to deliver sufficient current drive to maintain the output of the logic circuit in a disabled state during power up of the circuit. This is especially true if the logic circuit includes a plurality of data/output stages controlled by a single enable/disable circuitry.

Hence, a need exists for an improved power up circuitry for disabling the outputs of a logic circuit whereby the logic outputs are maintained in high impedance states during power up of the voltage supply and which using minimal power during normal operation of the logic circuit.

SUMMARY OF THE INVENTION

Accordingly, it is an object of the present invention to provide an improved power up disabling circuit for a logic circuit.

It is another object of the present invention to provide an improved circuit for a three state logic circuit for disabling the output(s) thereof during turn on of the logic circuit.

A further object of the invention is to provide an improved power up circuit for disabling the outputs of a logic circuit during turn on of the logic circuit which draws low power during normal operation of the logic circuit.

Still another object of the present invention is to provide an improved power up disabling circuit in combination with enabling circuitry of a three state logic circuit for maintaining the logic circuit in a high impedance output state during power up of the voltage supply to the circuit.

In accordance with the above and other objects there is provided a power up circuit coupled with the enable/disable circuit of a logic circuit for disabling the output of the logic circuit for until the voltage supply reaches a predetermined voltage level after the voltage supply is applied to the logic circuit comprising a voltage level detector circuit having an outout, first and second transistors each having their base coupled to the output of the voltage level detector circuit, the first transistor having its collector and emitter coupled to the enable/disable circuit and the second transistor having its collector-emitter conduction path coupled in parallel to the voltage level detector circuit, the first and second transistors being enabled for causing said enable/disable circuit to disable the output of the logic circuit until such time as the transistors are disabled by the voltage level detector circuit a predetermined time after the voltage supply is applied to the voltage level detector circuit and the logic circuit.

BRIEF DESCRIPTION OF THE DRAWING

THE sole FIGURE is a schematic diagram illustrating a three state logic circuit including the power up control circuit of the preferred embodiment.

DETAILED DESCRIPTION OF THE PREFERRED EMBODIMENT

Turning to THE FIGURE there is shown power up circuit 10 of the present invention which disables the output of the logic circuit in which it is incorporated to ensure that a high impedance output is presented thereat during initial voltage supply power up. Power up circuit 10 includes a voltage level detector circuit function consisting of a bias circuit and a switching transistor. The bias circuit comprises resistor 12, Schottky diode 14, diode connected transistors 16 and 18 and resistor 20, all of which are series connected between conductors 22 and 24 across which the voltage supply is applied. The switching transistor 26, a Schottky type transistor, has its collector coupled via resistor 28 to the positive supply conductor 22 and its emitter coupled to the negative supply conductor 24 while its base is coupled between the interconnection of the emitter of diode connected transistor 18 and resistor 20. An output is taken from the voltage level detector circuit at the collector of transistor 26. Transistor 26 either enables or disables transistors 30 and 32 which have there bases coupled to the collector of the former. The collector and emitter of transistor 30 is coupled to enable circuit 36 of logic circuit 34, for example, a three state logic circuit, and works in conjunction therewith as will be explained to disable the output 38 during power up of the logic circuit. The emitter and collector of transistor 32 are coupled to the emitter of transistor 30 and power supply conductor 22 respectively.

Logic circuit 34 is conventional in structure and includes data transfer section 40 comprising an input stage 42 and an output stage 44 in addition to enable section 36. It is understood that multiple data sections may be included on a single integrated chip each of which would be enabled or disabled by enable circuit 36. When enabled by an enabling signal applied to input 46, logic circuit 34 is responsive to applied logic data signals applied to input 48 to provide logic outputs at output 38. Because logic circuit 34 is conventional, for instance, a four bit shifter circuit such as the MC 74F350, which is manufactured by Motorola, Inc., only a brief description is herein provided. Only those elements necessary for describing the operation of power up circuit 10 of the present invention are designated by a reference numeral in order to briefly describe the operation of logic circuit 34.

In normal active operation, when the enable signal applied at input 46 is low, transistor 48 is turned off as transistors 50 and 52 are also turned off. As transistor 48 is non-conducting enable gate 36 has no effect on the operation of logic circuit 34. Hence, in the enabled state, data outputs at output 38 will follow the selective data input signals applied at input 54. Thus, for example, a logic one input data signal at input 54 causes transistors 56 and 58 to turn on. This in turn renders transistors 60 and 62 non-conducting since the collector of transistor 58 goes low while Darlington configured transistors 64 are turned on to force the output to go high, a logic one state. Similarly, a logic zero data input signal turns off transistors 56 and 58 which allows the collector of the latter to go high thereby turning on transistor 60. As transistor 60 is turned on, Darlington transistor pair 64 is turned off and transistor 62 is turned on. The output logic state thus switches from a high logic state to a low logic state. The third output state is when both Darlington transistor pair 64 and transistor 60 are non-conducting to force the output into a high impedance state as understood. Logic circuit 34 is forced into the high impedance or disabled state during the active operation by enable/disable gate 36. Logic circuit 34 is disabled by a high input signal being applied to input 46 of gate 36 which causes transistors 50, 52 and 48 to turn on. With transistor 48 turned on node 66 is low. Thus, transistors 60 and 62, as well as Darlington transistor pair 64, are forced to a non-conducting state since base current drive thereto is shunted through the collector-emitter conduction path of transistor 48. Hence, in response to the disable signal the data output of logic circuit 34 will be forced to the high impedance state.

During power up of the voltage supply, $V_{cc}$, is it is desired to disable logic circuit 34 to force the output to the high impedance state in order that there is no effect on the load connected to output 38. However, once powered up or after the voltage supply has reached a predetermined value logic circuit 34 should be placed in the active operating state. The prior art provides a means for accomplishing the foregoing but suffers from loading effect problems caused by multiple logic circuit stages 34 being coupled to node 66 which is over come by power up circuit 10 of the present invention as will be discussed hereinafter.

The operation of power up circuit 10 will now be discussed. Power up circuit 10 is identical to prior art circuits except that the prior art does not include transistor 32 illustrated in the present invention. The following discussion will first explain the operation of the prior art circuit (transistor 32 omitted) to described the limitations thereof and then the operation of the circuit of the present invention which includes the improvement.

During power up of $V_{cc}$, transistor 26 is held off until $V_{cc}$ reaches a value sufficient to develop a potential $V_{BE}$ across resistor 20 (where $V_{BE}$ is the base-emitter voltage of the transistor). Until transistor 26 is switched on transistor 30 is on and pulls current through resistors 28 and 68 thereby delivering base current drive to transistor 48 of enable gate 36. Node 66 is therefore at a logic "0". Transistor 48 should be sufficiently biased by the base drive thereto to drive it into saturation wherein it can sink all of the current from resistors 70, 72 and 80 via diodes 74, 76 and 82 to maintain transistors 60 and 62 and Darlington transistor pair 64 turned off. However, the prior art is limited in its ability to deliver sufficient base current to transistor 48 to drive it into saturation as the current flow to node 66 that has to be sank through the collector-emitter of the transistor increases due to multiple logic stages being coupled to the node. For instance, it can be shown for resistors 28, 68 and 78 having typical values of 20kΩ, 2kΩ and 1.6Ω respectively and standard transistors, transistor 48 will be supplied a base current of 12 microamperes assuming $V_{22}=2.3$ volts, $V_{BE}=900$ mV and $V_{CE}=300$ mV at an ambvient temperature of $-55$ degrees centigrade. Transistor 48 therefore should be able to sink a current of 360 microamperes from node 66 if its beta equals 30. If node 66 is coupled to four logic circuit stages 34 as in the aforementioned MC 74F350 product the current that can be sourced to node 66, at a value of $V_{cc}$ equal to 2.3 V can be shown to be equal to approximately 3.85 milliamperes, for the typical value of resistors. This resulting current is sufficient to pull transistor 48 out of saturation and, thus, transistor 48 would be incapable of holding the output stages of the four logic circuits in a high impedance state.

Power up circuit 10 of the present invention which includes transistor 32 will now be described to illustrate the vast improvement over the prior art circuit discussed above. If the ratio of the area of the emitter of transistor 32 to the area of the emitter of transistor 30 is equal to N (where N is a positive number) the emitter current of the former will be N times greater than the latter. Thus the new base current drive to transistor 48, assuming resistor 28 equals 5.5KΩ and resistors 68 and 78 have the same values as before, can be shown to be equal to 627 microamperes instead of 12 microamperes. Transistor 48 is then capable of sinking a current of 18.8 milliamperes from node 66, which is more than sufficient to sink the current source to node 66 by four logic circuit stages connected thereto. A similar sinking capability for transistor 48 can be realized if resistor 28 is reduced to 781Ω without transistor 32. However, an increase of current 6.65 milliamperes would result assuming $V_{cc}$ equals 5.5 V. The increase in current due to changing resistor 28 form 20kΩ to 5.5kΩ is only 685 microamperes. In fact, the circuit allows several additional stages to be coupled to node 66 to permit more logic functions to be accomplished on a single integrated circuit.

Hence, what has been described above is a novel improved power up circuit for use with multiple logic circuit stages on a single integrated circuit for holding the stages in a high impedance state during voltage supply power up.

What is claimed is:

1. In a logic circuit including an output stage and an enable gate having a transistor the collector-emitter conduction path of which is coupled to the output stage for disabling the same such that a high impedance is realized at the output of the output stage, the improvement comprising a power up circuit for disabling the output stage during power up of the voltage supply to the logic circuit, including:
   first and second conductors across which the voltage supply is provided;
   a detector circuit coupled between said first and second conductors which is responsive to the voltage supply for providing a control signal at an output thereof a predetermined time after the voltage supply is applied thereto; and
   first and second transistors each having a base coupled to the output of said detector circuit, a collector coupled to said first conductor and an emitter coupled to the base of the enable gate transistor for supplying current drive to the transistor, said first and second transistors being rendered non-conductive by said control signal from said detector circuit.

2. The power up circuit of claim 1 wherein said detector circuit includes:
   a bias circuit coupled between said first and second conductors for providing a bias potential at an output thereof; and
   a switching transistor having a base, an emitter and a collector, said base being coupled to said output of said bias circuit, said collector being coupled to said output of said detector circuit and said emitter being coupled to said second conductor, said output of said detector circuit being coupled to said first conductor.

3. An integrated circuit for providing a source of current at an output thereof for a predetermined time interval a source of operating potential is applied thereto, comprising:

first and second conductors across which the voltage supply is provided;

a detector circuit coupled between first and second conductors which is responsive to the voltage supply for providing a control signal at an output thereof a predetermined time after the voltage supply is applied thereto; and first and second transistors each having a base coupled to the output of said detector circuit, a collector coupled to said first conductor and an emitter coupled to the base of the enable gate transistor for supplying current drive to the transistor, said first and second transistors being rendered non-conductive by said control signal from said detector circuit.

4. The circuit of claim 3 wherein said time delay circuit includes:

a bias circuit coupled between said first and second conductors for providing a bias potential at an output thereof;

a switching transistor having a base, an emitter and a collector, said base being coupled to said output of said bias circuit, said collector being coupled to said output of said detector circuit and said emitter being coupled to said second conductor, said output of said detector circuit being coupled to said first conductor.

* * * * *